United States Patent
Hsieh et al.

(12) 
(10) Patent No.: US 6,455,431 B1
(45) Date of Patent: Sep. 24, 2002

(54) NH$_3$ PLASMA DESCUMMING AND RESIST STRIPPING IN SEMICONDUCTOR APPLICATIONS

(75) Inventors: Chang Lin Hsieh, San Jose; Hui Chen, Santa Clara; Jie Yuan, San Jose; Yan Ye, Saratoga, all of CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/629,329

(22) Filed: Aug. 1, 2000

(51) Int. Cl.$^7$ ................. H01L 21/302; H01L 21/461
(52) U.S. Cl. ........................ 438/691; 438/710
(58) Field of Search ............. 438/691, 720, 438/734, 742, 775, 781, 788, 780, 597, 647, 669, 694, 704, 948, 710, 725, 729, 739

(56) References Cited

U.S. PATENT DOCUMENTS

| | | | |
|---|---|---|---|
| 5,674,357 A | * 10/1997 | Sun et al. ............... | 134/1.2 |
| 5,980,768 A | 11/1999 | Abraham ................ | 216/67 |
| 6,153,530 A | * 11/2000 | Ye et al. ................ | 438/720 |
| 6,207,583 B1 | * 3/2001 | Dunne et al. ........... | 438/725 |

* cited by examiner

Primary Examiner—David Nelms
Assistant Examiner—Phuc T. Dang
(74) Attorney, Agent, or Firm—Shirley L. Church; Joseph Bach

(57) ABSTRACT

In general, the present disclosure pertains to a method for removing photoresist from locations on a semiconductor structure where its presence is undesired. In one embodiment, a method is disclosed for descumming residual photoresist material from areas where it is not desired after patterning of the photoresist. In another embodiment, a misaligned patterned photoresist is stripped from a semiconductor substrate surface. In particular, the method comprises exposing the semiconductor structure to a plasma generated from a source gas comprising NH$_3$. A substrate bias voltage is utilized in both methods in order to produce anisotropic etching. In the descumming embodiment, the critical dimensions of the patterned photoresist are maintained. In the photoresist stripping embodiment, a patterned photoresist is removed without adversely affecting a partially exposed underlying layer of an organic dielectric.

22 Claims, 8 Drawing Sheets

NH₃ PLASMA DESCUMMING AND RESIST STRIPPING IN SEMICONDUCTOR APPLICATIONS

BACKGROUND OF THE INVENTION

1. Field of the Invention

In general, the present invention relates to a method for removing photoresist from locations on a semiconductor structure where its presence is undesired. One embodiment pertains to a method of removing residual photoresist (descumming) from a surface underlying the photoresist layer after patterning (opening) the photoresist. Another embodiment pertains to a method of removing a patterned photoresist layer from an underlying surface when the patterned photoresist is misaligned from its desired location on the underlying surface.

2. Brief Description of the Background Art

A patterned photoresist layer is often used as a template for pattern etching an underlying layer which functions as a hard mask during the etching of layers which underlie the hard mask. Frequently, the hard mask is formed from an inorganic material such as silicon oxide or silicon nitride (or a combination thereof).

FIG. 1 shows a typical prior art semiconductor structure 100 which includes, from bottom to top, a silicon substrate 102, overlaid with a layer 104 of an organic-based dielectric material, overlaid with a hard mask layer 106, and a patterned photoresist layer 108. After patterning of the photoresist layer 108, there are often "feet" 110 remaining at the interface between the patterned photoresist layer 108 and the hard mask layer 106, as shown in FIG. 1. The presence of these "feet" makes it difficult to maintain control of the critical dimensions of a pattern etched in the hard mask layer 106 (and the critical dimensions of features etched in the organic dielectric layer 104 underlying hard mask layer 106).

FIG. 2 shows a second prior art semiconductor structure 200, which may occur as an intermediate structure in a dual damascene process. This structure 200 includes, from bottom to top, a substrate layer 202, a contact via 210 etched in an organic dielectric layer 204, a patterned hard mask layer 206, and a second, patterned photoresist layer photoresist 214, which was deposited after etching of contact via 210. Any residual material from the first patterned layer of photoresist (not shown) which was used to pattern hard mask 206 was removed after etching of contact via 210. Then, an additional layer 214 of photoresist was deposited and patterned in order to provide a template for pattern etching the hard mask layer 206 to provide trenches which connect between contact vias (for example, and not by way of limitation). However, as illustrated in FIG. 2, an error occurred during patterning of second photoresist layer 214, and the opening 216 in second patterned photoresist layer 214, which was intended to be centered over contact via 210 is misaligned. By this time, considerable expense has been incurred in the formation of the structure 200 shown in FIG. 2, and rather than discard the structure 200, it is desired to remove the misaligned second patterned photoresist layer 214 and to reapply a new photoresist layer.

In the past, since most photoresists are comprised of organic materials, a plasma formed from oxygen (O₂) gas has been used to remove the "feet" 110 of the kind shown in FIG. 1 (descumming) and to strip misaligned photoresist from a semiconductor structure of the kind shown in FIG. 2 (reworking). However, even when a bias voltage is applied to the substrate, etching with O₂ is isotropic. With respect to the structure illustrated in FIG. 1, this may cause a change in the critical dimension (an enlargement) of the pattern in patterned photoresist layer 108 by the time the feet 110 are removed. With respect to the structure illustrated in FIG. 2, this may cause undercutting of the organic dielectric layer 204 toward its base, as illustrated by the broken lines indicating areas 218. Also, etching with O₂ is very fast, making it difficult to maintain good control over the amount of photoresist which is removed (or organic dielectric layer which is inadvertently removed).

It would be desirable to provide an effective process for descumming that would not result in a change in the critical dimension of the patterned photoresist. It would also be desirable to provide a method for removal of misaligned patterned photoresist that would not disturb an underlying organic dielectric material.

SUMMARY OF THE INVENTION

We have discovered a method of residual photoresist descumming which does not impact the critical photoresist pattern dimensions. In addition, basically the same etch chemistry can be used to strip misaligned patterned photoresist layers during a rework process without causing significant harm to layers of organic dielectric material which are separated from the misaligned patterned resist layer by an inorganic hard mask layer, or by an organic hard mask layer which is resistant to the etch chemistry of the method. These methods utilize a plasma etch where the plasma is generated from a source gas which is primarily (at least 50%) comprised of NH₃. In many instances, the plasma source gas is preferably solely NH₃. A relatively high substrate bias voltage (typically about –100 V to about –1,000 V) is applied; the result is vertically directed anisotropic etching, where ionized nitrogen and hydrogen species, for example, are more active at the base of an opening in the substrate structure than at the lateral sidewalls of the opening. This avoids undercutting of the patterned photoresist layer during descumming. In the case of reworking, the hard mask layer shields the underlying organic dielectric layer at the top of the opening, and this, combined with the anisotropic direction of etch, reduces damage to the previously etched dielectric layer underlying the hard mask layer.

DETAILED DESCRIPTION OF THE PREFERRED EMBODIMENTS

Figure 1:
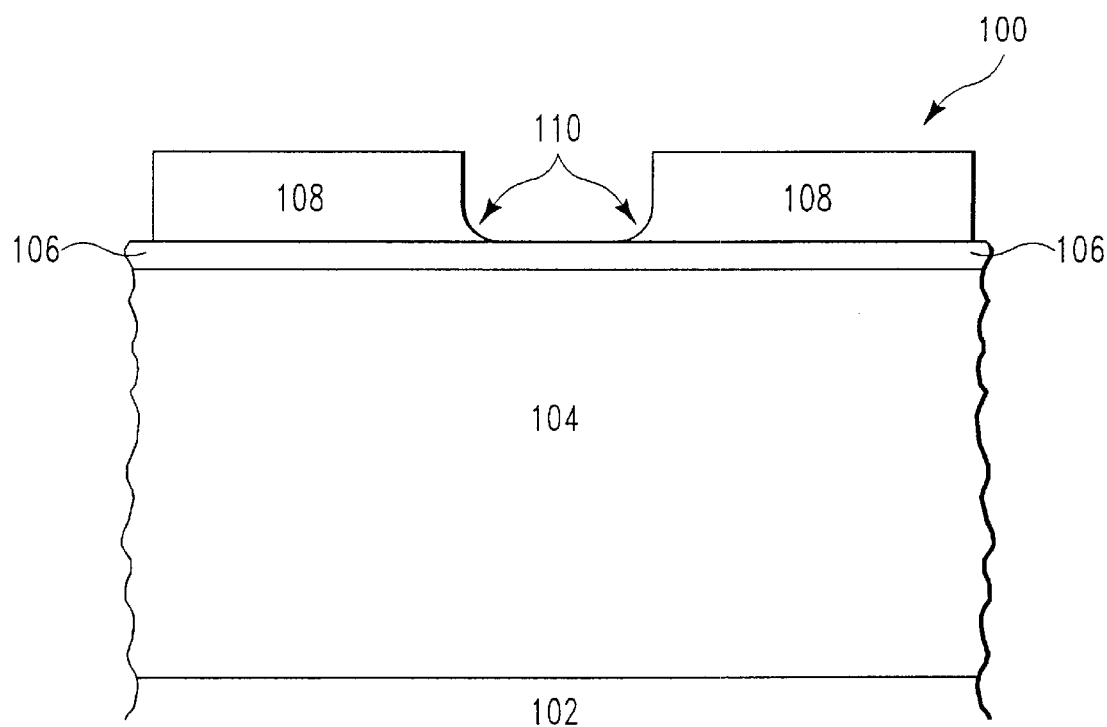
FIG. 1 shows a prior art semiconductor structure 100 including, from top to bottom, a patterned photoresist layer 108, a hard mask layer 106, an organic dielectric layer 104, and the underlying substrate layer 102.
Figure 2:
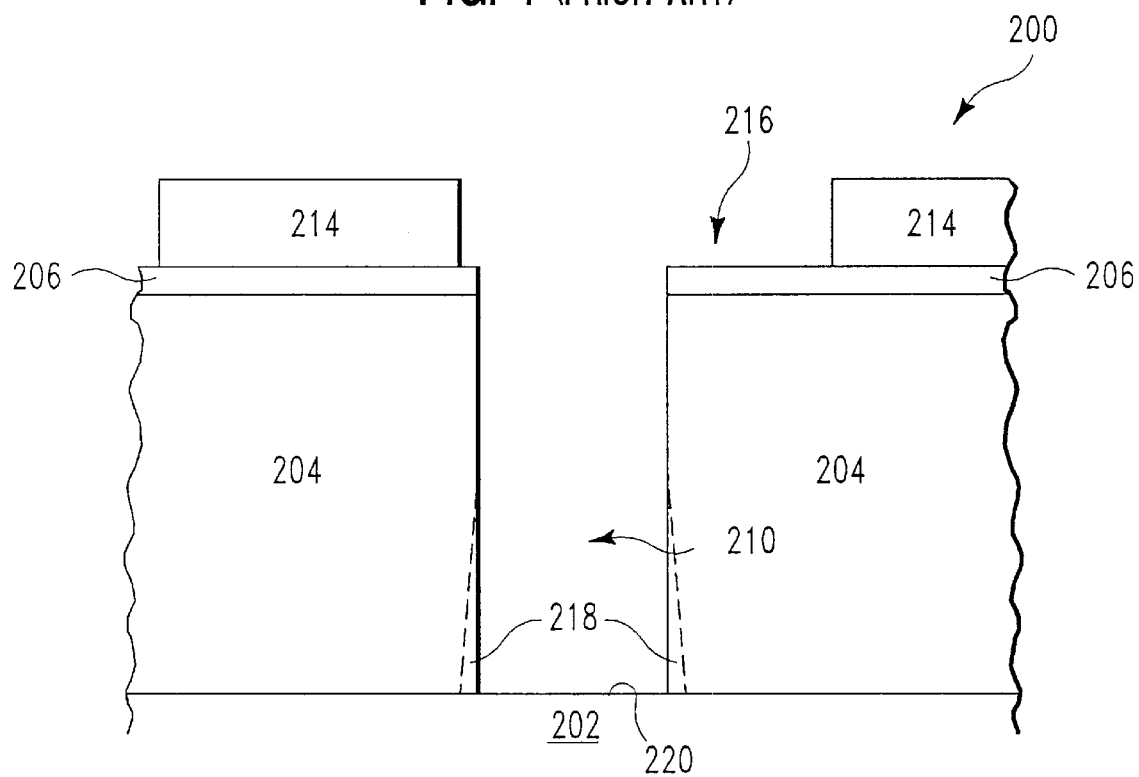
FIG. 2 shows a prior art "dual damascene" semiconductor structure 200 including, from top to bottom, a second patterned photoresist layer 214, a patterned hard mask layer 206, a contact via 210 etched into a layer 204 of an organic dielectric material underlying patterned hard mask layer 206, and underlying substrate 202. In this illustration, photoresist layer 208 has been incorrectly patterned, and the pattern is misaligned with contact via 210.

Disclosed herein is method of descumming a semiconductor structure, to remove residual photoresist from areas where it is not desired after patterning of the photoresist. In one embodiment, the photoresist descumming is carried out over a substrate which includes from top to bottom, a layer of patterned photoresist; an underlying layer of hardmasking material; a layer of an organic dielectric material (frequently a low k dielectric material); and an underlying substrate. It is desired to remove residual photoresist from the surface of the hardmasking material, where the residual material is present in the opened areas of the pattern.

The method of the invention comprises exposing the semiconductor structure to a plasma generated from a source gas comprising ammonia ($NH_3$). $NH_3$ typically comprises at least 50% of the source gas. A substrate bias voltage within the range of about −100 V to about −1,000 V is typically applied during the performance of the descumming method of the invention. For an IPS™ dielectric etch chamber, the substrate bias power applied ranges from about 100 W to about 400 W, to obtain this substrate bias voltage.

The hardmasking layer typically comprises silicon oxide or silicon nitride, or a combination thereof. The organic low k dielectric material is typically selected from the group consisting of Poly(arylene)ethers; Poly(arylene)ether oxazoles; Fluorinated poly(arylene)ethers; Parylene-N; Parylene-F; Parylene-AF; Parylene-AF4; Polyimides; Polynapthalene-N; Polynaphthalene-F; Perfluorocyclobutene; Polytetrafluoroethylene; Polyphenyl-Quinoxalines; Polybenzoxazoles; Polyindane; Polynorborene; Polystyrene; Polyphenyleneoxide; Polyethylene; Polypropylene; alpha-carbons; SILK™; BCB; FPI; FLARE 2.0; and combinations thereof.

Also disclosed herein is a method of stripping a misaligned, patterned photoresist from a semiconductor structure. In one embodiment, the photoresist stripping is carried out over a substrate which includes, from top to bottom: a layer of misaligned, patterned photoresist; an underlying layer of hardmasking material; a layer of an organic dielectric material (frequently a low k dielectric material) which has a contact via or other feature etched therein; and, an underlying substrate. It is desired to remove the misaligned, patterned photoresist from the surface of the underlying structure with minimal effect on, or damage to, the etched layer of organic dielectric material and the substrate underlying that material.

The method comprises exposing the semiconductor structure to a plasma generated from a source gas comprising $NH_3$. Ammonia ($NH_3$) typically comprises at least 50% of the source gas. A substrate bias voltage within the range of about −100 V to about −1,000 V is typically applied during the performance of the photoresist stripping method of the invention. For an IPS™ dielectric etch chamber, the substrate bias power applied typically ranges from about 100 W to about 400 W.

The hard mask layer typically comprises silicon oxide or silicon nitride, or a combination thereof. The organic low k dielectric material is typically selected from the group consisting of Poly(arylene)ethers; Poly(arylene)ether oxazoles; Fluorinated poly(arylene)ethers; Parylene-N; Parylene-F; Parylene-AF; Parylene-AF4; Polyimides; Polynapthalene-N; Polynaphthalene-F; Perfluorocyclobutene; Polytetrafluoroethylene; Polyphenyl-Quinoxalines; Polybenzoxazoles; Polyindane; Polynorborene; Polystyrene; Polyphenyleneoxide; Polyethylene; Polypropylene; alpha-carbons; SILK™; BCB; FPI; FLARE 2.0; and combinations thereof.

The invention provides methods of descumming and photoresist stripping of semiconductor structures which do not result in damage to underlying organic layers, including organic dielectric layers, and in particular, organic low k dielectric material layers. Since most photoresists are organic materials, it is difficult to remove residual photoresist material, or to strip a photoresist layer for rework without affecting other layers of organic material which are present in the structure. This method has provided unexpected results in enabling the accomplishment of this difficult task. The methods of the invention provide excellent critical dimension control during pattern etching of the hard mask layer and subsequent etching of features in an organic dielectric material.

The methods of the invention are useful for semiconductor structures having feature sizes as small as 0.13 μm.

As a preface to the detailed description of the preferred embodiments, it should be noted that, as used in this specification and the appended claims, the singular forms "a", "an", and "the" include plural referents, unless the context clearly dictates otherwise. In addition, the term "substrate" includes semiconductor materials, glass, ceramics, polymeric materials, and other materials of use in the semiconductor industry.

I. An Apparatus for Practicing the Invention

Figure 3:
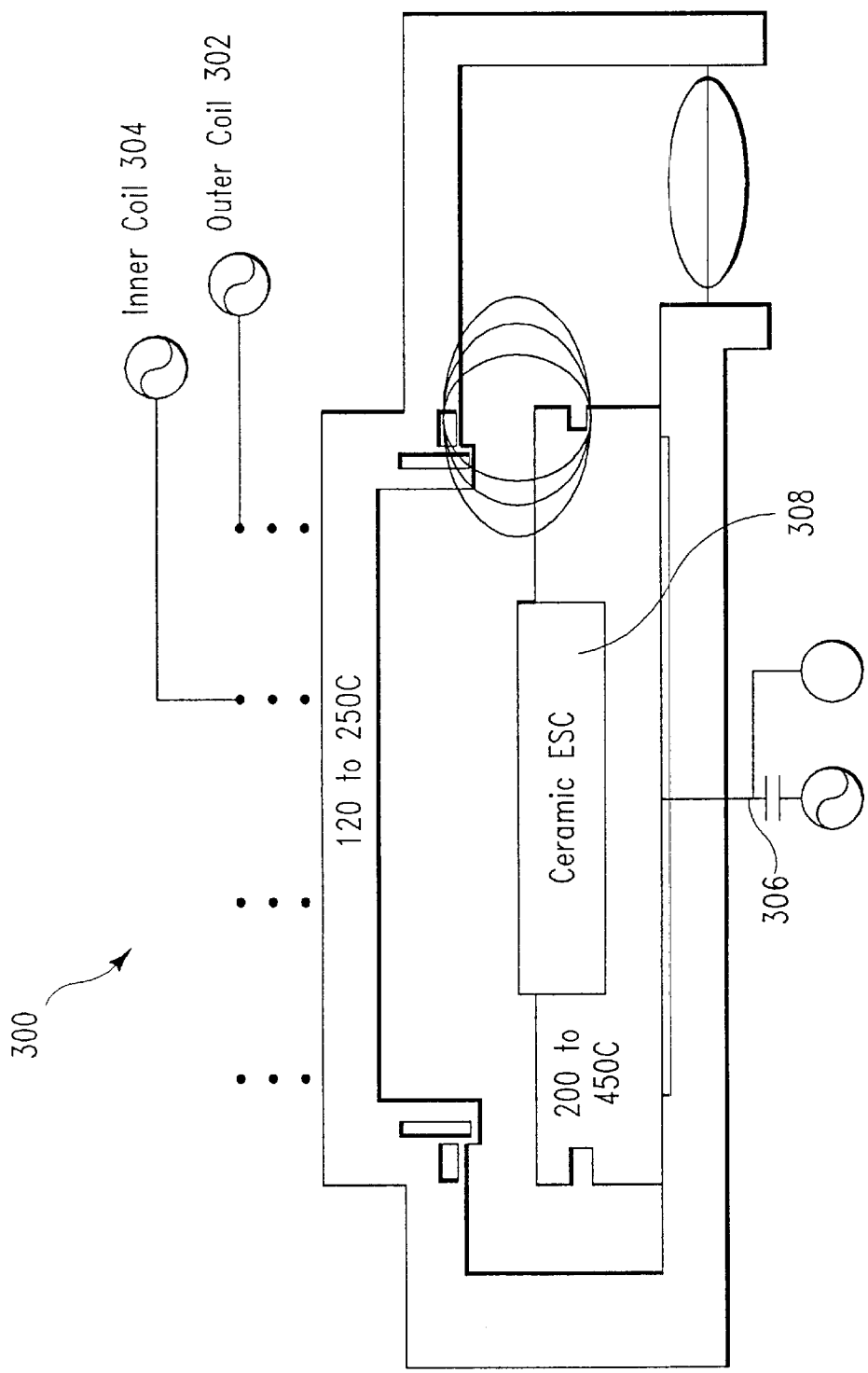
FIG. 3 shows an example of an apparatus which can be used to practice the method of the invention, the Applied Materials IPS™ dielectric etch chamber (designated by reference numeral 300). The IPS™ chamber 300 includes two plasma power sources, provided by an outer coil 302 and an inner coil 304. Substrate bias power source 306 permits application of bias to a substrate being processed.

FIG. 3 shows an example of an apparatus which can be used to practice the methods of the invention, the Applied Materials IPS™ dielectric etch chamber (designated by reference numeral 300). The IPS™ chamber 300 includes two plasma power sources, provided by an outer coil 302 (frequency typically tuned at 2.0±0.1 MHZ) and an inner coil 304 (frequency typically tuned at 2.3±0.1 MHZ), both of which are located exterior to chamber 300. A substrate (typically a silicon wafer) is held in place upon a ceramic electrostatic chuck (substrate support platen) 308. A bias voltage may be applied to substrate support platen 308 by means of bias power source 306 (frequency typically tuned at 1.7±0.2 MHZ).

The methods of the invention disclosed herein are preferably performed in an apparatus having separate power controls for the plasma source power and substrate bias power.

Figure 4A:
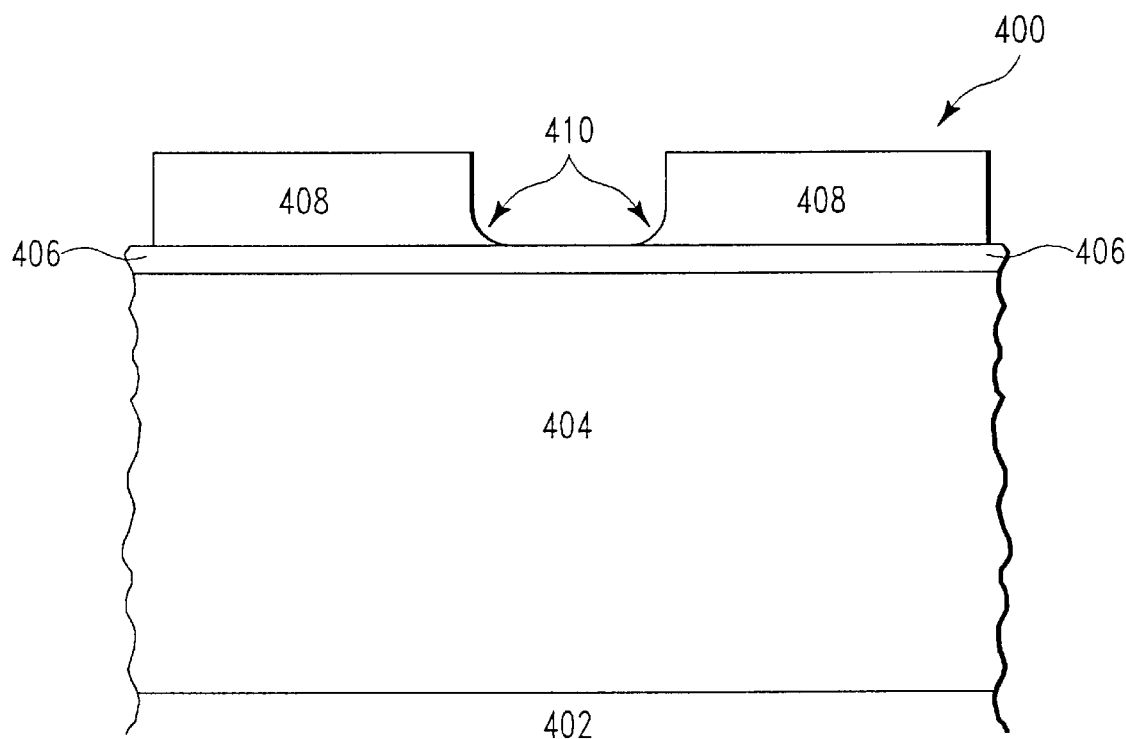
FIG. 4A shows a beginning semiconductor structure 400 of the kind known in the art which exhibits feet 410 at the base of patterned photoresist layer 408. Patterned photoresist layer 408 overlies a hard mask layer 406, and a layer 404 of an organic low k dielectric material, all of which overlie a substrate 402.

II. Embodiments Illustrating the Methods of the Invention for Photoresist Descumming and Stripping Referring to the figures, FIG. 4A shows a typical semiconductor structure 400 to which the method of the invention is applied. Semiconductor structure 400, as shown in FIG. 4A, includes, from top to bottom, a patterned photoresist layer 408, a hard mask layer 406, and a layer 404 of an organic low k dielectric material, all deposited on a substrate 402, which is typically silicon or silicon nitride.

The organic low k dielectric material may be any carbon and hydrogen-containing low k dielectric material including, for example, but not limited to, Poly(arylene)ethers; Poly(arylene)ether oxazoles; Fluorinated poly(arylene)ethers; Parylene-N; Parylene-F; Parylene-AF; Parylene-AF4; Polyimides; Polynapthalene-N; Polynaphthalene-F; Perfluorocyclobutene; Polytetrafluoroethylene; Polyphenyl-Quinoxalines; Polybenzoxazoles; Polyindane; Polynorborene; Polystyrene; Polyphenyleneoxide; Polyethylene; Polypropylene; alpha-carbons; SILK™M; BCB; FPI; FLARE 2.0; as well as combinations of any of these materials, which have a dielectric constant lower than that of silicon dioxide. In particular, the term "organic low k dielectric material" refers to a carbon and hydrogen-based dielectric material having a dielectric constant ("k") value lower than 4.0.

The low k dielectric material is deposited on the substrate according to methods known in the art, depending on the particular low k dielectric material used. The layer 404 of organic low k dielectric material is typically deposited to have a thickness within the range of about 7000 Å to about 11,000 Å.

The hard mask layer 406 is typically silicon oxide or silicon nitride, or a combination thereof, but could also be silicon carbide or silicon oxynitride. The hard mask layer 406 is deposited overlying the organic low k dielectric material layer 404 according to methods known in the art, depending on the particular hard mask material used. The hard mask layer 406 is typically deposited to have a thickness within the range of about 1000 Å to about 2000 Å.

Deposited overlying the hard mask layer 406 is a photoresist layer 408, which may be any suitable photoresist material known in the art. The photoresist is an organic, carbon-containing material. The applied thickness and patterning method for the photoresist layer 408 will depend on the particular photoresist material used. For patterns having a feature size less than about 0.25 μm, the photoresist most frequently used is a DUV photoresist available from either JSR or Shipley. The term "feature" refers to, but is not limited to, interconnects, contacts, vias, trenches, and other structures which make up the topography of the substrate surface. The term "feature size" typically refers to the smallest dimension of a feature. A typical film thickness for a DUV photoresist used to produce a feature size of less than about 0.25 μm ranges from about 4,000 Å to about 10,000 Å.

After patterning of the photoresist, there are often "feet" 410 remaining at the interface between the patterned photoresist layer 408 and the hard mask layer 406, as shown in FIG. 4A. The present invention provides a method for "descumming" the semiconductor structure 400 shown in FIG. 4A, whereby the feet 410 are removed.

The method of the invention for descumming the semiconductor structure 400 shown in FIG. 4A includes exposing the structure to a plasma generated from a source gas comprising $NH_3$ for a short period of time (typically, about 15–60 seconds). Although the source gas may include other, inert gases (such as argon, helium, or xenon) or may include nitrogen, use of gases other than $NH_3$ may be less desirable in some instances, because this tends to slow down the rate of descumming. If other gases are included in the plasma source gas, they should represent less than 50 volume % of the total gas flow. In the IPS™ apparatus, a typical total gas flow is about 200 sccm, of which gases other than $NH_3$ are typically less than about 100 sccm.

A moderate bias voltage within the range of about −100 V and −1,000 V is typically applied to the substrate during the descumming process in order to direct high energy species generated within the plasma toward the substrate. This provides anisotropic removal of the feet 410 at the base of the patterned photoresist layer 408. In the Applied Materials IPS™ dielectric etch chamber shown in FIG. 3, or an equivalent apparatus, a bias power within the range of about 100 W to about 400 W is typically applied to produce a substrate bias voltage which provides the desired results. A typical descumming time ranges from about 15 seconds to about 60 seconds, depending on the substrate bias applied. For example, when a higher bias power is used, descumming time is typically shorter than when a lower bias power is used. Commonly applicable process conditions for descumming a semiconductor structure according to the method of the invention are presented in Table 1.

TABLE 1

Preferred Process Conditions for Descumming and Photoresist Stripping

| Process Parameter | Range of Process Conditions | Preferred Process Conditions | More Preferred Process Conditions |
|---|---|---|---|
| $NH_3$ Flow Rate (sccm) | 50–200 | 75–150 | 75–125 |
| $N_2$ Flow Rate (sccm) | 0–100 | 0–50 | 0–50 |
| He Flow Rate (sccm) | 0–100 | 0–50 | 0 |
| Ar Flow Rate (sccm) | 0–100 | 0–50 | 0 |
| Plasma Source Power - Outer (W) | 600–2000 | 600–1500 | 600–1200 |
| Plasma Source Power - Inner (W) | 100–1200 | 200–1000 | 200–800 |
| Substrate Bias Power (W) | 100–1000 | 100–800 | 100–600 |
| Process Chamber Pressure (mTorr) | 5–60 | 5–40 | 5–40 |
| Substrate Temperature (° C.) | −15 to +15 | −15 to +15 | −15 to +15 |

Figure 4B:
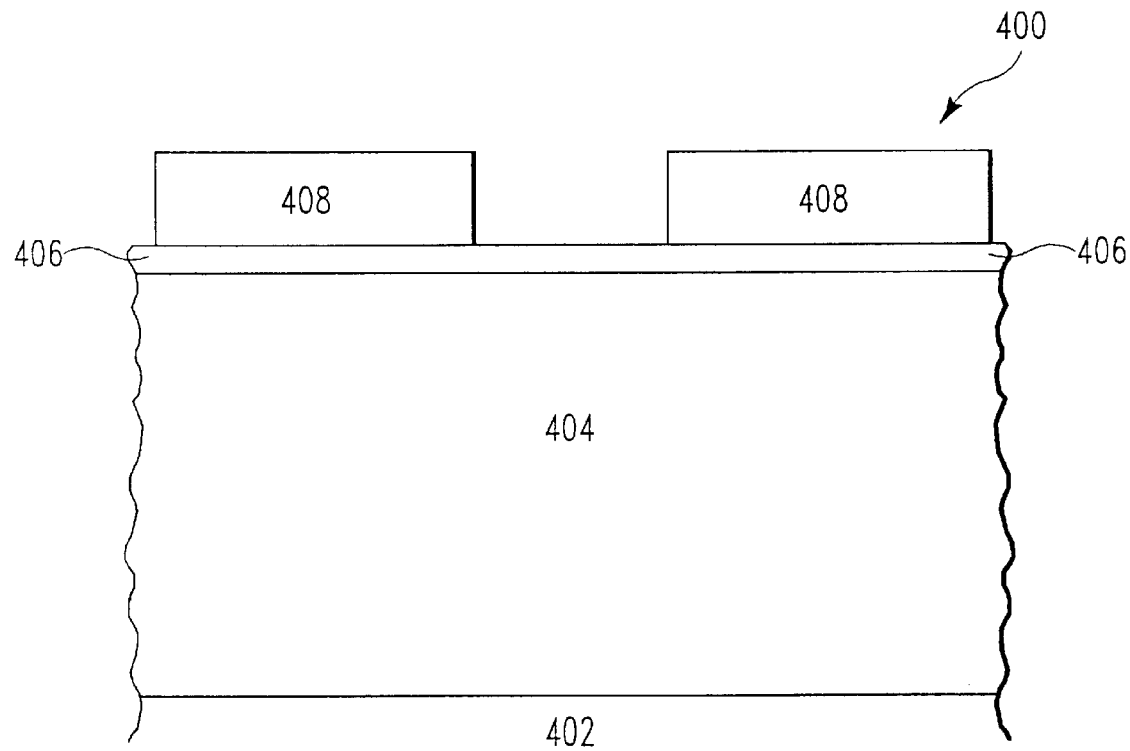
FIG. 4B shows the semiconductor structure 400 after descumming according to the method of the invention.
Figure 4C:
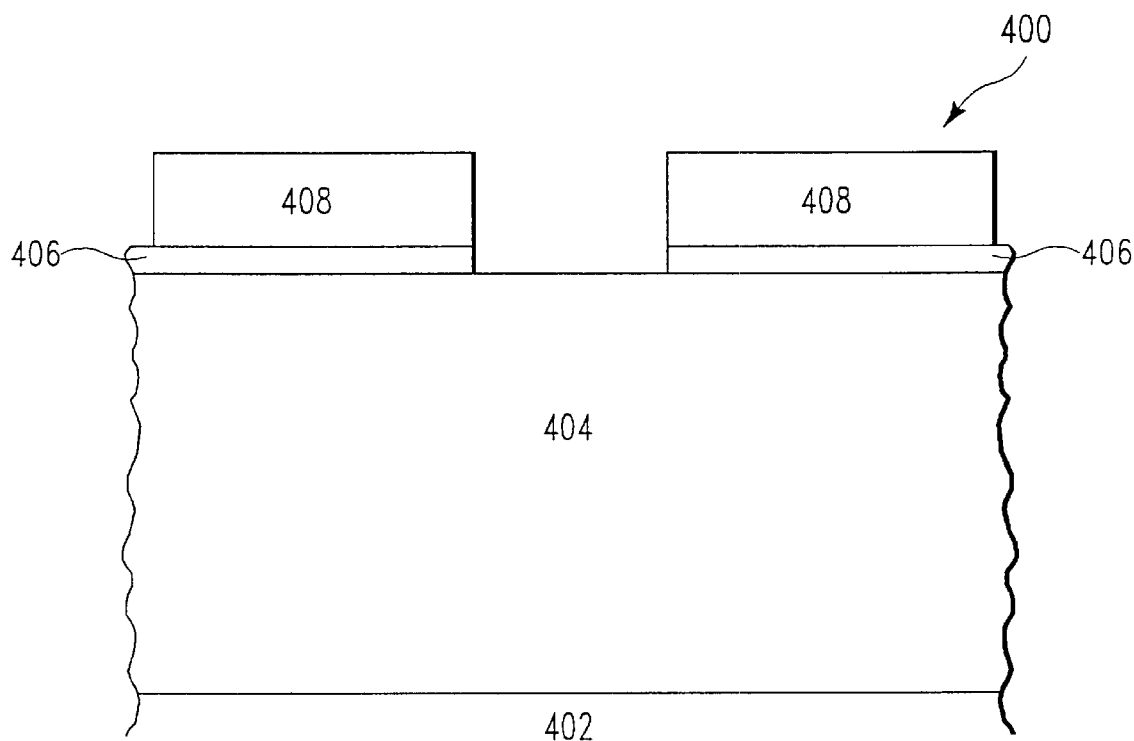
FIG. 4C shows the semiconductor structure 400 of FIG. 4B after pattern etching of the hard mask layer 406.

FIG. 4B shows the semiconductor structure 400 after descumming according to the method of the invention. Following descumming, the hard mask layer 406 is pattern etched using the patterned photoresist layer as a template, to provide the structure shown in FIG. 4C. Pattern etching of the hard mask layer 406 is performed according to methods known in the art, depending on the particular hard mask material used. When the hard mask layer 406 is silicon oxide, a typical plasma source gas containing a reactive etchant such as a fluorine-containing compound is used. The plasma source gas may also contain a chlorine-containing compound and/or various inert gases known in the art. The total gas flow is commonly about 300 sccm; other process conditions include 1200–2000 W plasma source power (outer); 500–1000 W plasma source power (inner); 800–1800 W substrate bias power; 5–60 mTorr process chamber pressure; −15 to +15° C. substrate temperature; 30 seconds typical etch time for a 2000 Å thick layer of silicon oxide hard mask material.

Figure 4D:
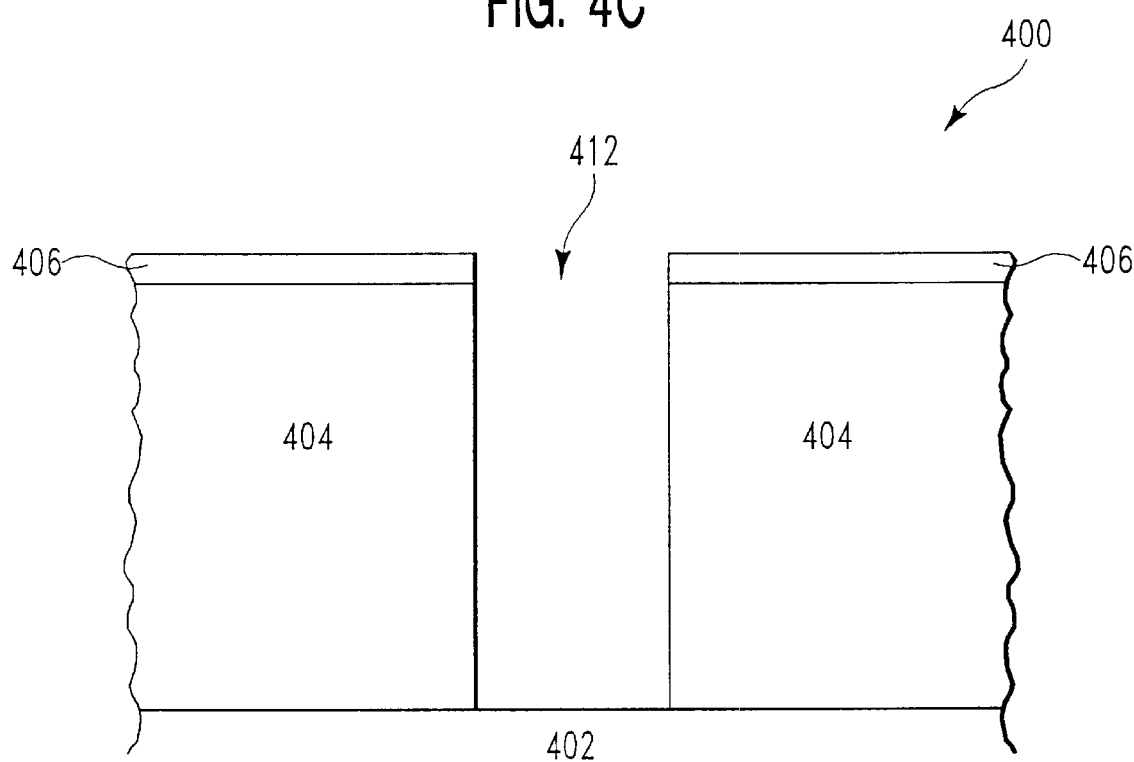
FIG. 4D shows the semiconductor structure 400 of FIG. 4C after etching of a contact via 412 in the organic low k dielectric layer 404.
Figure 4E:
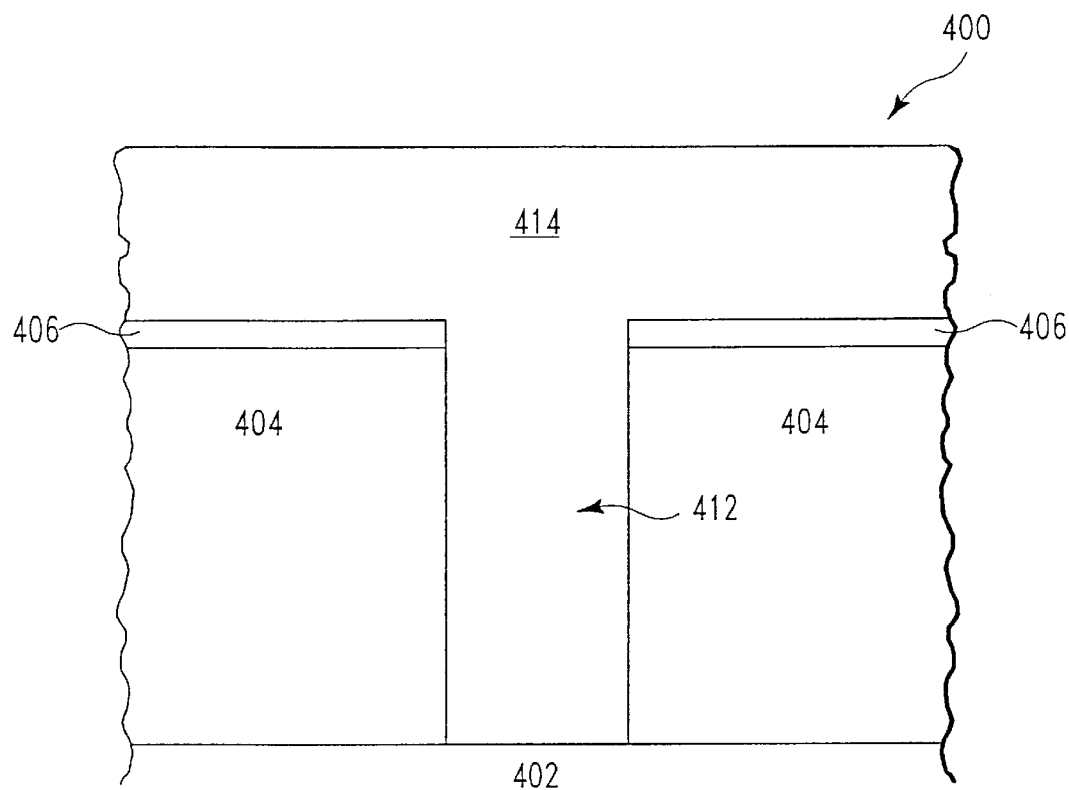
FIG. 4E shows the semiconductor structure 400 of FIG. 4D after deposition of a second, new photoresist layer 414.

After pattern etching the hard mask layer 406, a contact via 412 is etched in the organic low k dielectric layer 404, as shown in FIG. 4D. Etching of the organic low k dielectric material is carried out using the method most appropriate for the particular dielectric material. Typical process conditions for etching a contact via 412 in a layer of low k dielectric 404 of SILK™ or FLARE™ are as follows: 50–300 sccm of plasma source gas flow, where the plasma source gas may contain reactive etchants more commonly used in the art such as at least one of $O_2$, a fluorine-containing compound, a chlorine-containing compound, and a bromine-containing compound. Often, a chemically inert gas is used in combination with the oxygen or halogen-containing source gas etchant species. In the alternative, the low k dielectric may be etched using a hydrogen/nitrogen-based plasma source gas. This hydrogen/nitrogen-based plasma source gas may comprise ammonia, hydrogen, nitrogen, or a combination thereof as the reactive etchant species. A hydroxyl amine may be used as the reactive etchant species when copper is not the conductive layer used in the device. Again, a chemically inert gas may be used in combination with the reactive etchant species. Typically, the total gas flow rate for hydrogen and nitrogen based plasma source gas typically ranges from about 50 to about 300 sccm. Other process conditions are as follows: 800–1200 W plasma source power (outer); 300–600 W plasma source power (inner); 300–600 W substrate bias power; 5–40 m Torr process chamber pressure; −15° C. substrate temperature. Preferably, when the hydrogen/nitrogen-based plasma source gas is used, the etch plasma is a high density plasma having a plasma density of at least $5 \times 10^{10}$ $e^-/cm^3$. A typical etch time for an 8000 Å thick layer of SILK™ or FLARE™ is about 90 seconds. After etching of the contact via 412, the via may be filled with a conductive material (such as aluminum or copper) according to methods known in the art, or further processing of the semiconductor structure may be performed prior to the application of metal, as in a dual damascene process. In a method for forming a dual damascene structure, a second photoresist layer 414 is deposited over the semiconductor structure 400, as shown in FIG. 4E. The second photoresist layer 414 is then patterned according to methods known in the art, depending on the particular photoresist used. At times there is an inadvertent error in alignment of the pattern in second photoresist layer 414 with an underlying pre-metallization structure, such as via 412. The result is a misaligned patterning of the second photoresist layer 414 as shown in FIG. 4F.

Figure 4F:
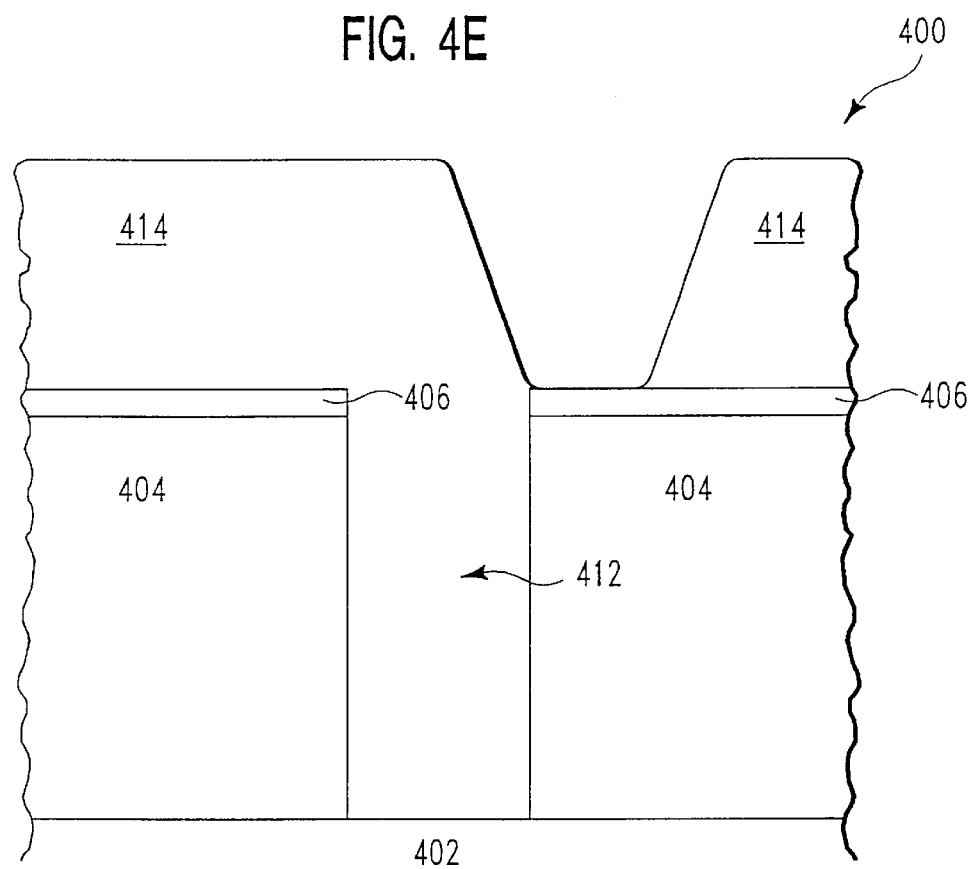
FIG. 4F shows the semiconductor structure 400 of FIG. 4E after patterning of photoresist layer 414. In this instance, the opening in second photoresist layer 414 was intended to be centered over via 412, but the patterning of second photoresist layer 414 was misaligned with respect to via 412.

Since a considerable expense has been incurred in producing the structure shown in FIG. 4F, it is desirable to rework the structure, to redeposit the second photoresist layer 412, and to repattern the photoresist.

The present invention also provides a method for stripping a misaligned, patterned photoresist layer. The stripping method of the invention includes exposing the semiconductor structure to a plasma generated from a source gas comprising $NH_3$. Typical process conditions for photoresist stripping are set forth in Table 1, above. Performing the method of the invention using the process conditions set forth in Table 1 provides a photoresist removal rate of about 2000 to 6000 Å per minute. The optimum time period for performing the photoresist stripping process can be calculated based on the deposited thickness of the photoresist layer 414.

Figure 4G:
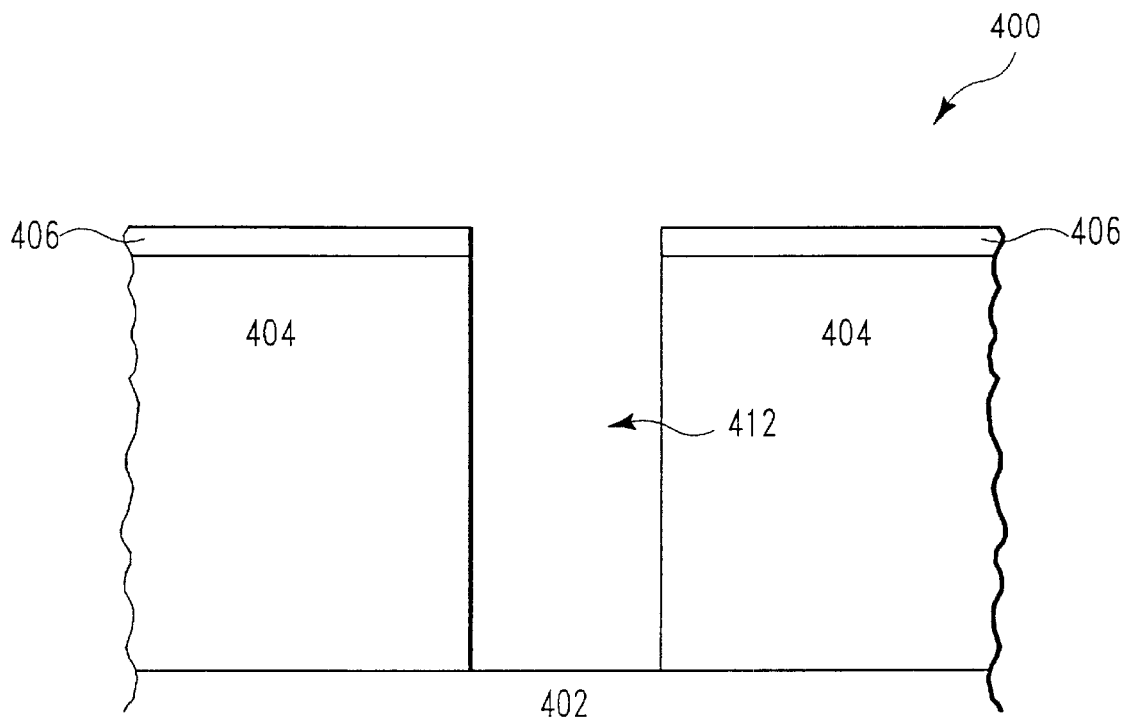
FIG. 4G shows the semiconductor structure 400 of FIG. 4F after stripping of the second photoresist layer 414, according to the method of the invention.
Figure 4H:
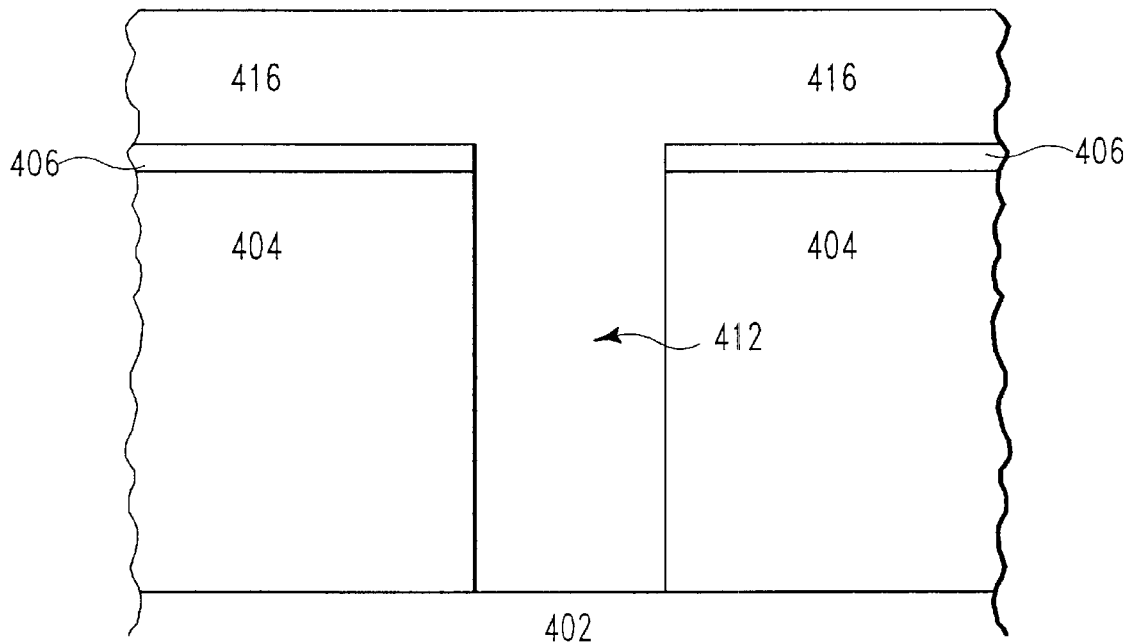
FIG. 4H shows the semiconductor structure 400 of FIG. 4G after deposition of a third photoresist layer 416.

FIG. 4G shows the semiconductor structure 400 after stripping of the second photoresist layer according to the method of the invention. Subsequently, a third, new layer 416 of photoresist is deposited over the semiconductor structure 400, as shown in FIG. 4H.

Figure 4I:
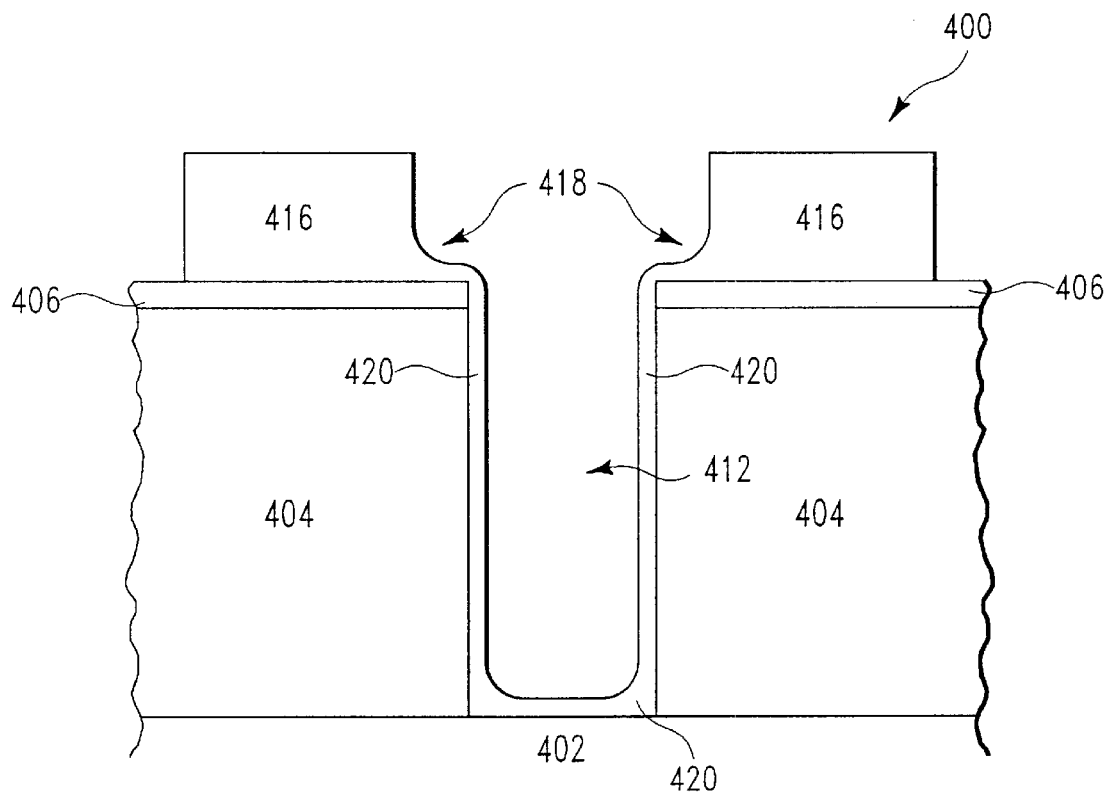
FIG. 4I shows the semiconductor structure 400 of FIG. 4H after patterning of photoresist layer 416, including "feet" 418 overlying patterned hard mask layer 406. Residual photoresist 420 may also be present on the sidewalls and bottom of contact via 412.

The third, new photoresist layer 416 is then patterned according to methods known in the art, depending on the particular photoresist used. FIG. 4I shows a semiconductor structure 400 with a correctly aligned, patterned photoresist layer 416. Again, there are feet 418 at the interface between the patterned photoresist layer 416 and the hard mask layer 406. Residual photoresist 420 may also be present on the sidewalls and bottom of the contact via 412.

Figure 4J:
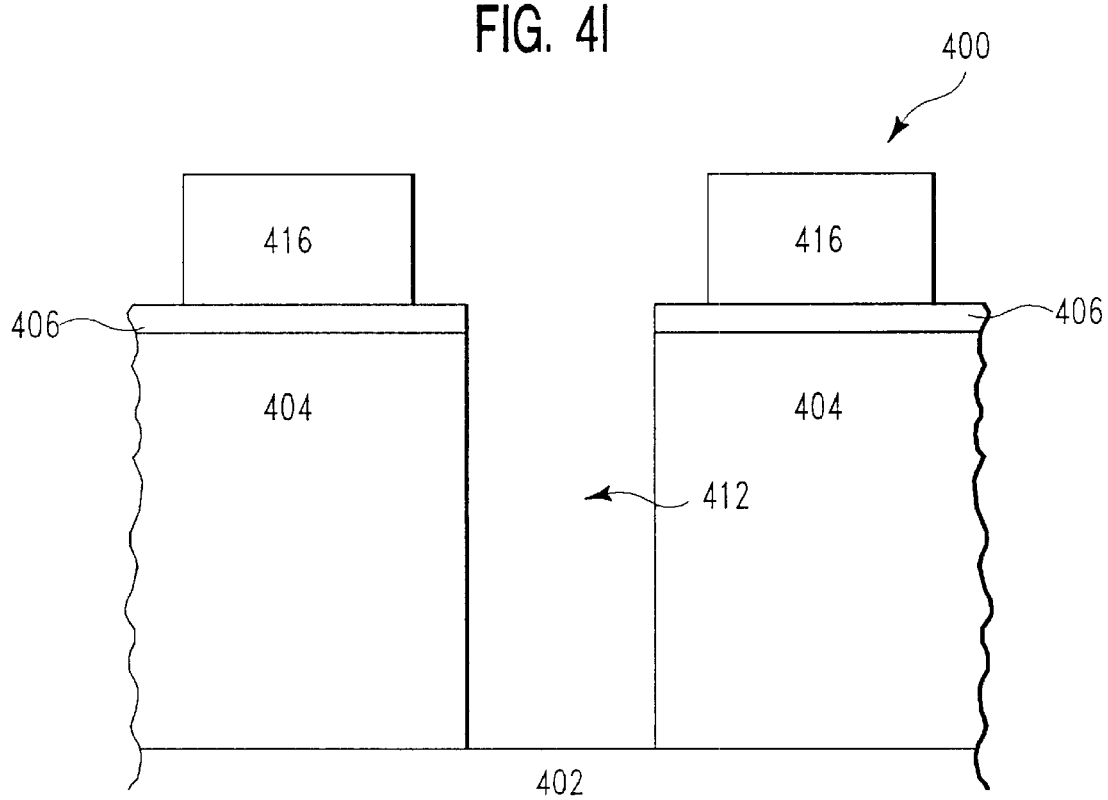
FIG. 4J shows the semiconductor structure 400 of FIG. 4J after descumming according to the method of the invention.

A second descumming process may then be performed according to the method of the invention. Typical process conditions for descumming are set forth in Table 1, above. The second descumming process results in removal of the "feet" 418, as well as residual photoresist 410 present on the sidewalls and bottom of the contact via 412. FIG. 4J shows the semiconductor structure 400 after performance of the second descumming process.

Figure 4K:
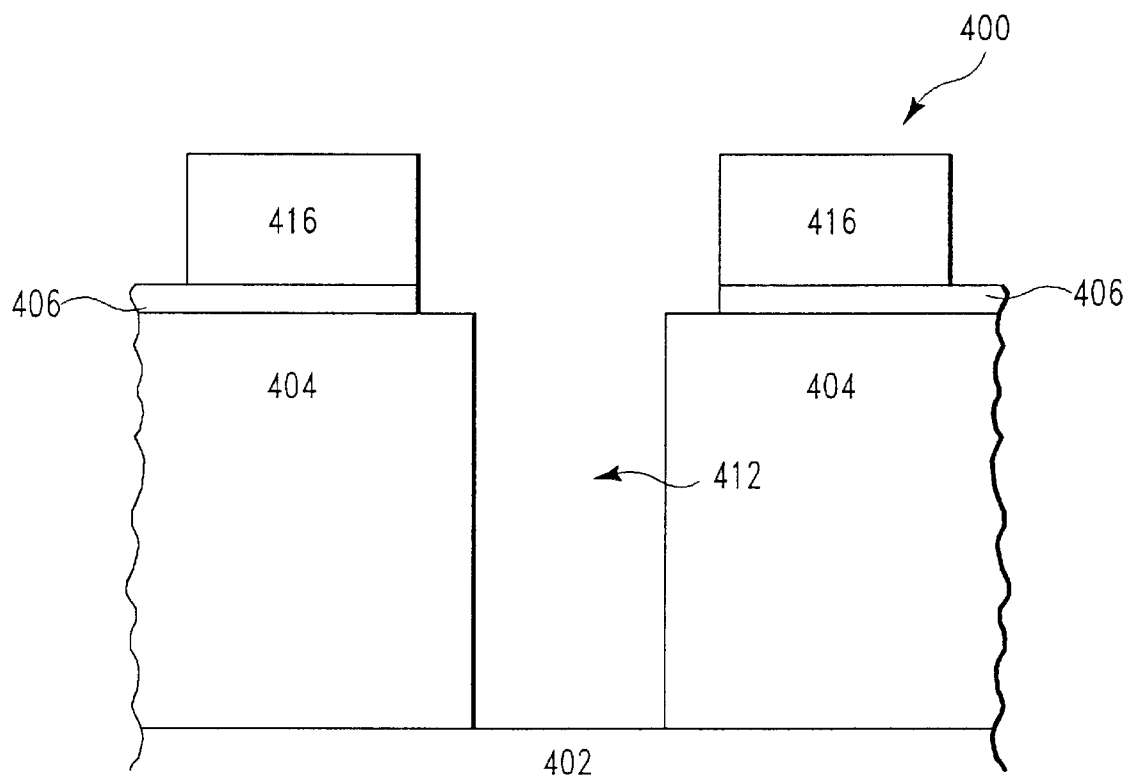
FIG. 4K shows the semiconductor structure 400 of FIG. 4J after second pattern etching of the hard mask layer 406.

Pattern etching of the hard mask layer 406 is then performed, using the patterned photoresist layer as a template. Typical process conditions for pattern etching a silicon oxide hard mask layer are presented above. FIG. 4K shows the semiconductor structure 400 after second pattern etching of the hard mask layer 406.

Figure 4L:
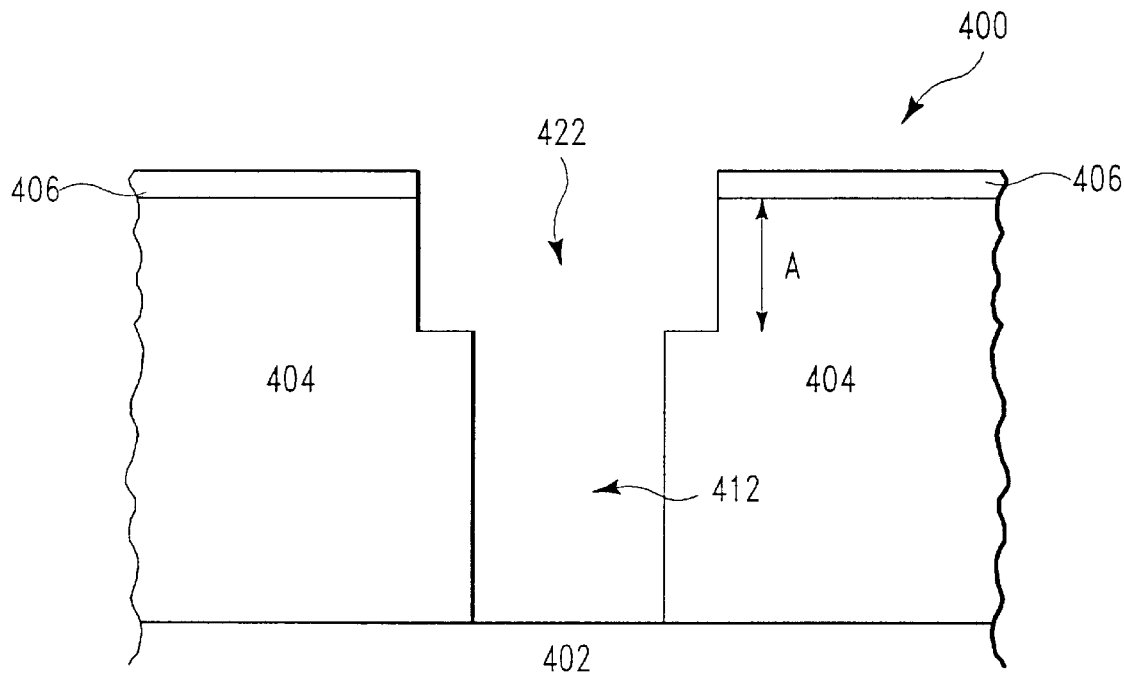
FIG. 4L shows the semiconductor structure 400 of FIG. 4K after etching of a trench 422 to a desired depth "A" in the organic low k dielectric layer 404.

After a second pattern etching of the hard mask layer 406, a trench 422 is etched in the organic low k dielectric layer 404 to a desired depth "A", as shown in FIG. 4L. Etching the organic low k dielectric material is performed according to methods known in the art. Typical process conditions for etching a trench 422 in the low k dielectric layer are as previously described with reference to etching of via 412.

At this point, the trench 422 and underlying contact via 412 can be filled with a conductive material (such as aluminum or copper) according to methods known in the art. Alternatively, further processing can be performed if a more complex structure is desired.

The methods of the invention described above for photoresist descumming and photoresist stripping have minimal affect on underlying organic layers such as the organic dielectric layer. The methods of the invention provide excellent critical dimension control during pattern etching of the hard mask layer and subsequent etching of features in the organic low k dielectric material.

The methods of the invention are useful for semiconductor structures having feature sizes as small as 0.13 μm.

The above described preferred embodiments are not intended to limit the scope of the present invention, as one skilled in the art can, in view of the present disclosure expand such embodiments to correspond with the subject matter of the invention claimed below.

We claim:
1. A method of descumming organic residue from a semiconductor structure which includes a patterned photoresist layer in a manner which does not impact a critical dimension of said patterned photoresist layer, by contacting said semiconductor structure with a plasma etchant where the chemically reactive plasma species are generated from $NH_3$.

2. The method of claim 1, wherein underlying said patterned photoresist layer is a hard mask layer comprising silicon oxide or silicon nitride or a combination thereof.

3. The method of claim 1, wherein $NH_3$ comprises at least 50 volume % of a source gas used to produce said plasma.

4. The method of claim 1, wherein a substrate bias voltage is applied to said semiconductor structure during said descumming, and wherein said bias voltage is within the range of about −100 V to about −1,000 V.

5. The method of claim 1, wherein a power ranging from about 100 W to about 400 W is applied to bias said substrate during said descumming.

6. The method of claim 2, wherein said hard mask layer is not patterned.

7. The method of claim 2, wherein said hard mask layer is patterned, and wherein underlying said hard mask layer is a layer of organic dielectric material.

8. The method of claim 7, wherein said organic dielectric material is a low k dielectric material.

9. The method of claim 7, wherein said low k dielectric material is selected from the group consisting of Poly(arylene)ethers; Poly(arylene)ether oxazoles; Fluorinated poly(arylene)ethers; Parylene-N; Parylene-F; Parylene-AF; Parylene-AF4; Polyimides; Polynapthalene-N; Polynaphthalene-F; Perfluorocyclobutene; Polytetrafluoroethylene; Polyphenyl-Quinoxalines; Polybenzoxazoles; Polyindane; Polynorborene; Polystyrene; Polyphenyleneoxide; Polyethylene; Polypropylene; alpha-carbons; SILK™; BCB; FPI; FLARE 2.0™; and combinations thereof.

10. The method of claim 7, wherein said organic dielectric material layer includes an etched contact via.

11. A method of stripping a patterned photoresist layer from a semiconductor structure including said patterned photoresist layer, without adversely affecting an exposed organic layer underlying said patterned photoresist layer, by contacting said semiconductor structure with a plasma etchant where the chemically reactive species in said plasma etchant are generated from $NH_3$.

12. The method of claim 11, wherein a patterned hard masking layer underlies said patterned photoresist layer and overlies a portion of said exposed organic layer.

13. The method of claim 12, wherein said hard masking layer is selected from the group consisting of silicon oxide, silicon nitride, silicon oxynitride, and silicon carbide.

14. The method of claim 11, wherein a layer of organic dielectric underlies said patterned hard masking layer.

15. The method of claim 14, wherein said organic dielectric layer is a low k dielectric layer.

16. The method of claim 15, wherein said low k dielectric material is selected from the group consisting of Poly(arylene)ethers; Poly(arylene)ether oxazoles; Fluorinated poly(arylene)ethers; Parylene-N; Parylene-F; Parylene-AF; Parylene-AF4; Polyimides; Polynapthalene-N; Polynaphthalene-F; Perfluorocyclobutene; Polytetrafluoroethylene; Polyphenyl-Quinoxalines; Polybenzoxazoles; Polyindane; Polynorborene; Polystyrene; Polyphenyleneoxide; Polyethylene; Polypropylene; alpha-carbons; SILK™; BCB; FPI; FLARE 2.0; and combinations thereof.

17. The method of claim 11, wherein $NH_3$ comprises at least 50 volume % of a source gas used to produce said plasma etchant.

18. The method of claim 17, wherein a substrate bias voltage is applied to said semiconductor structure during said stripping of said patterned photoresist, and wherein said bias voltage is within the range of about −100 V to about −1,000 V.

19. The method of claim 17, wherein a power ranging from about 100 W to about 400 W is applied to bias said substrate during said photoresist layer stripping.

20. A method for descumming organic residue from a semiconductor structure which includes a patterned photoresist layer overlying a hard mask layer, which hard mask layer comprises silicon oxide, or silicon nitride, or a combination thereof, and wherein said hard mask layer overlies a layer of a low k dielectric organic material selected from the group consisting of Poly(arylene)ethers, Poly(arylene) ether oxazoles, Fluorinated poly(arylene)ethers, Parylene-N, Parylene-F, Parylene-AF, Parylene-AF4, Polyimides, Polynapthalene-N, Polynaphthalene-F, Perfluorocyclobutene, Polytetrafluoroethylene, Polyphenyl-Quinoxalines, Polybenzoxazoles, Polyindane, Polynorborene, Polystyrene, Polyphenyleneoxide, Polyethylene, Polypropylene, alpha-carbons, SILK™, BCB, FPI, FLARE 2.0™; and combinations thereof, wherein said descumming does not impact a critical dimension of said patterned photoresist layer, and wherein said descumming is carried out by contacting said semiconductor structure with a plasma etchant where the chemically reactive plasma species are generated from $NH_3$.

21. The method of claim 20, wherein said low k dielectric organic material comprises an etched contact via.

22. A method for stripping a patterned photoresist layer from a semiconductor structure including said patterned photoresist layer, without adversely affecting an exposed organic low k dielectric layer underlying said patterned photoresist layer, wherein said organic low k dielectric layer is a material selected from the group consisting of Poly(arylene)ethers; Poly(arylene)ether oxazoles; Fluorinated poly(arylene)ethers; Parylene-N; Parylene-F; Parylene-AF; Parylene-AF4; Polyimides; Polynapthalene-N; Polynaphthalene-F; Perfluorocyclobutene; Polytetrafluoroethylene; Polyphenyl-Quinoxalines; Polybenzoxazoles; Polyindane; Polynorborene; Polystyrene; Polyphenyleneoxide; Polyethylene; Polypropylene; alpha-carbons; SILK™; BCB; FPI; FLARE 2.0; and combinations thereof, and wherein said stripping is carried out by contacting said semiconductor structure with a plasma etchant where the chemically reactive species in said plasma etchant are generated from $NH_3$.

* * * * *